United States Patent
Lan et al.

(10) Patent No.: US 8,358,167 B2
(45) Date of Patent: Jan. 22, 2013

(54) PHOTO SENSING UNIT AND PHOTO SENSOR THEREOF

(75) Inventors: Wei-Chou Lan, Hsinchu (TW); Sung-Hui Huang, Hsinchu (TW); Chia-Chun Yeh, Hsinchu (TW); Ted-Hong Shinn, Hsinchu (TW)

(73) Assignee: E Ink Holdings Inc., Hsinchu (TW)

( * ) Notice: Subject to any disclaimer, the term of this patent is extended or adjusted under 35 U.S.C. 154(b) by 234 days.

(21) Appl. No.: 12/974,206

(22) Filed: Dec. 21, 2010

(65) Prior Publication Data

US 2012/0138919 A1 Jun. 7, 2012

(30) Foreign Application Priority Data

Dec. 3, 2010 (TW) .............................. 99142103 A

(51) Int. Cl.
| H01L 27/144 | (2006.01) |
| H01L 31/062 | (2006.01) |
| H01L 31/09 | (2006.01) |
| H01L 31/10 | (2006.01) |
| H03K 17/30 | (2006.01) |
| H03K 17/687 | (2006.01) |

(52) U.S. Cl. . 327/514; 257/291; 257/462; 257/E31.054; 257/E31.082; 257/290; 327/515

(58) Field of Classification Search .................. 257/290, 257/291, 431, 462, E31.082, E31.053, 428, 257/443, E31.054; 327/514, 515
See application file for complete search history.

(56) References Cited

U.S. PATENT DOCUMENTS

| 6,566,685 B2 | 5/2003 | Morikawa et al. |
| 7,349,018 B2 | 3/2008 | Doering et al. |
| 2006/0016964 A1 | 1/2006 | Ogawa |
| 2010/0044711 A1* | 2/2010 | Imai ................................ 257/59 |

FOREIGN PATENT DOCUMENTS

| TW | 527572 B | 4/2003 |
| TW | 571580 B | 1/2004 |
| TW | I266043 B | 11/2006 |

* cited by examiner

*Primary Examiner* — Evan Pert
(74) *Attorney, Agent, or Firm* — Rosenberg, Klein & Lee

(57) ABSTRACT

A photo sensing unit used in a photo sensor includes a photo sensing transistor, a storage capacitor, and a switching transistor. The photo sensing transistor receives a light signal for inducing a photo current correspondingly, and a source and a gate thereof are respectively coupled to the first signal source and the second signal source. The storage capacitor stores electrical charges induced by the light signal, one terminal thereof is coupled to drain of the photo sensing transistor, and another terminal thereof is coupled to a low voltage. The switching transistor is controlled by the second signal source for outputting a readout signal from the storage capacitor to the signal readout line. The threshold voltage of the photo transistor is higher than that of the switching transistor.

20 Claims, 2 Drawing Sheets

PHOTO SENSING UNIT AND PHOTO SENSOR THEREOF

BACKGROUND

1. Technical Field

The present disclosure relates to a photo sensor, in particular, to a photo sensing unit of the photo sensor.

2. Description of Related Art

The design of modern electronic devices with low power consumption has been generally toward the direction of development to follow with the trend of the times. Shown in FIG. 1, FIG. 1 is a circuit diagram of a traditional photo sensing unit 10. The photo sensing unit 10 includes a photo sensing transistor TFT2, a switching transistor TFT1 and a storage capacitor Cs, wherein the first signal source V1, the second signal source V2, and the third signal source V3 are essentially provided to the photo sensing unit 10. In addition, a signal readout line READOUT is coupled to the switching transistor TFT 1. This can be seen as, gates of the photo sensing transistor TFT2 and the switching transistor TFT1 respectively need independent signal sources V2 and V3 to individually give the control signals, such that the number of needed signal sources is increased, and the power consumption may be not reduced.

SUMMARY

An exemplary embodiment of the present disclosure provides a photo sensing unit. The photo sensing unit comprises a photo sensing transistor, a storage capacitor, and a switching transistor, wherein a threshold voltage of the photo transistor is higher than that of the switching transistor. A source of the photo sensing transistor is coupled to a first signal source, and a gate of the photo sensing transistor is coupled to a second signal source. The storage capacitor has two ends, wherein a first end of the two ends is coupled to a drain of the photo sensing transistor, and a second end of the two ends is coupled to a low voltage. A source of the switching transistor is coupled to the first end of the storage capacitor and the drain of the photo sensing transistor. A drain of the switching transistor is coupled to a signal readout line, and a gate of the switching transistor is coupled to the second signal source. The photo sensing transistor receives a light signal for inducing a photo current correspondingly. The storage capacitor stores electrical charges induced by the light signal. The switching transistor is controlled by the second signal source for outputting a readout signal from the storage capacitor to the signal readout line.

In accordance with the exemplary embodiment of the present disclosure, when the photo sensing transistor receives a light signal in an exposure time, the second signal source provides a write voltage, wherein the write voltage is lower than threshold voltages of the photo sensing transistor and the switching transistor. Meanwhile, the photo sensing transistor and the switching transistor are turned off, and the first signal source provides a bias voltage to the source of the photo sensing transistor, such that the storage capacitor can store electrical charges induced by the photo sensing transistor. After the exposure time has elapsed, the second signal source provides a readout voltage during the readout time, wherein the voltage level of the readout voltage is between the threshold voltages of the photo sensing transistor and the switching transistor. Therefore, the switching transistor is turned on, and the readout signal of the storage capacitor will be output to the signal readout line via the switching transistor.

Furthermore, an exemplary embodiment of the present disclosure provides a photo sensor. The photo sensor comprises a plurality of photo sensing units, a first signal source circuit, a second signal source circuit, and an outputting circuit. The first signal source circuit is used to provide first signal sources to the photo sensing units, and the second signal source circuit is used to provide second signal sources to the photo sensing units. The outputting circuit is used to receive readout signals outputted from the photo sensing units, and to output the readout signals sequentially. Each of the photo sensing units comprises a photo sensing transistor, a storage capacitor, and a switching transistor. The photo sensing transistor has a first gate, a first source, and a first drain, and is used to receive a light signal for inducing a photo current correspondingly, wherein the first source is coupled to the first signal source, and the first gate is coupled to the second signal source. The storage capacitor has a first end and a second terminal, and is used to store a plurality of electrical charges induced from the light signal, wherein the first end is coupled to the first drain, and the second end is coupled to a low voltage. The switching transistor being controlled by the second signal source has a second gate, a second source, and a second drain, and is used to output the readout signal stored in the storage capacitor to signal readout line, wherein the second source is coupled to the first end, and the second drain is coupled to the signal readout line, and the second gate is coupled to the second signal source. A threshold voltage of the photo sensing transistor is higher than that of the switching transistor.

In summary, gates of the switching transistor and photo sensing transistor of the photo sensing unit provided by the exemplary embodiment the present disclosure may share the same signal source, such that a number of needed signal sources may be reduced, and power saving may be achieved.

In order to further understand the techniques, means and effects the present disclosure takes for achieving the prescribed objectives, the following detailed descriptions and appended drawings are hereby referred, such that, through which, the purposes, features and aspects of the present disclosure can be thoroughly and concretely appreciated; however, the appended drawings are merely provided for reference and illustration, without any intention to be used for limiting the present disclosure.

DESCRIPTION OF THE EXEMPLARY EMBODIMENTS

Exemplary Embodiment of Photo Sensing Unit

Figure 1:
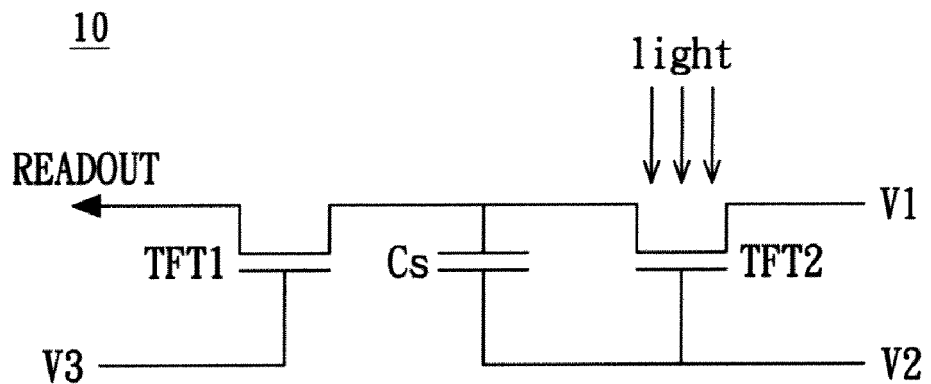
FIG. 1 is a circuit diagram of a traditional photo sensing unit.
Figure 2:
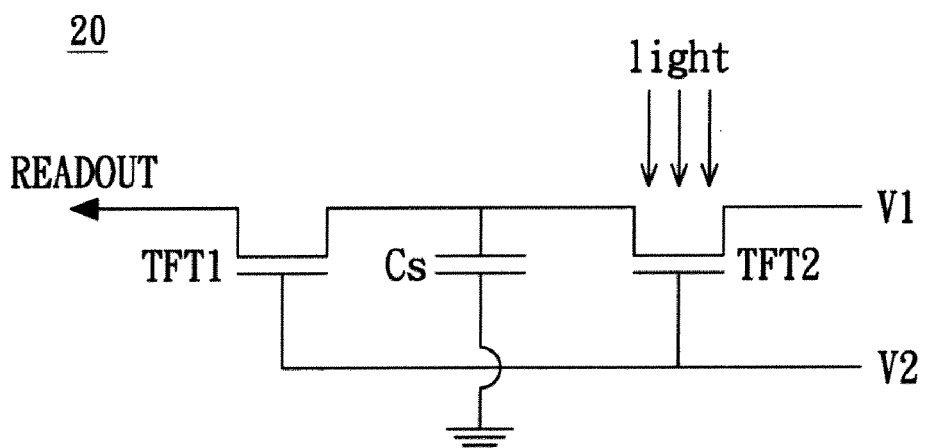
FIG. 2 is a circuit diagram of a photo sensing unit according to an exemplary embodiment of the present disclosure.

FIG. 2 is a circuit diagram of a photo sensing unit according to an exemplary embodiment of the present disclosure. Photo sensing unit 20 comprises a photo sensing transistor TFT2, a storage capacitor Cs, and a switching transistor TFT1, wherein a threshold voltage Vth2 of the photo sensing transistor TFT2 is larger than a threshold voltage Vth1 of the switching transistor TFT1.

Referring to FIG. 2, a source of the photo sensing transistor TFT2 is coupled to a first signal source V1, and a gate of the photo sensing transistor TFT2 is coupled to a second signal source V2. The storage capacitor Cs has two ends, wherein a first end of the two ends is coupled to a drain of the photo sensing transistor TFT2, and a second end of the two ends is coupled to a low voltage. In addition, a source of the switching transistor TFT1 is coupled to the first end of the storage capacitor Cs and the drain of the photo sensing transistor TFT2, the drain of the switching transistor TFT1 is coupled to the signal readout line READOUT, and the gate of the switching transistor TFT1 is coupled to the second signal source V2.

Figure 3:
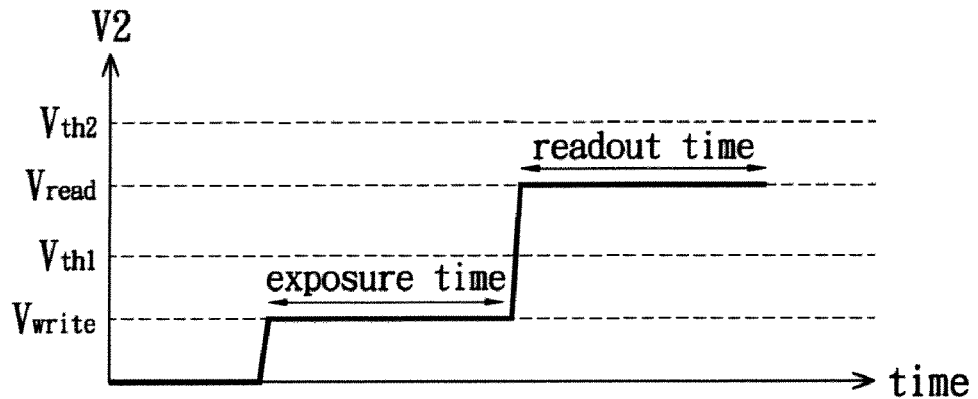
FIG. 3 is a waveform diagram of a second signal source according to an exemplary embodiment of the present disclosure.

Referring to FIG. 2 and FIG. 3, FIG. 3 is a waveform diagram of a second signal source according to an exemplary embodiment of the present disclosure. When the photo sensing transistor TFT2 receives a light signal, the second signal source V2 provides a write voltage Vwrite, wherein the write voltage Vwrite is lower than the threshold voltage Vth2 of the photo sensing transistor TFT2 and the threshold voltage Vth1 of the switching transistor TFT1. Meanwhile, the photo sensing transistor TFT2 and the switching transistor TFT1 are turned off, and the first signal source V1 now can be a fixed bias voltage, such that the photo current can flow to the storage capacitor Cs, and the storage capacitor Cs can store the electrical charges induced from the light signal received by the photo sensing transistor TFT2. By the way, the time when the second signal source provides the write voltage Vwrite is called "exposure time" as shown in FIG. 3.

When the exposure time has elapsed, the second signal source V2 provides a readout voltage Vread, wherein the voltage level of the readout voltage between the threshold voltage Vth2 of the photo sensing transistor TFT2 Vth2 and the threshold voltage Vth1 of switching transistor TFT1. Hence the switching transistor TFT1 is turned on, and the readout signal stored in storage capacitor Cs is transmitted to the signal readout line READOUT via the switching transistor to TFT 1. By the way, the time when the second signal source V2 provides the readout voltage Vread is called readout time as shown in FIG. 3.

In addition, it is noted that, though the readout voltage Vread and the write voltage Vwrite in FIG. 3 are fixed voltage levels, the readout voltage Vread and the write voltage Vwrite in other kinds of exemplary embodiment may not be fixed voltage levels, such as the readout voltage Vread and the write voltage Vwrite may be gradually increasing voltages. In short, the waveform type of the readout voltage Vread and the write voltage Vwrite is not intended to limit the present disclosure. However the write voltage Vwrite is lower than the threshold voltage Vth2 of the photo sensing transistor TFT2 and the threshold voltage Vth1 of the switching transistor TFT1, and the readout voltage Vread is between the threshold voltage Vth2 of the photo sensing transistor TFT2 and the threshold voltage Vth1 of the switching transistor TFT1.

In addition, the photo sensing transistor TFT2 may be an oxide thin film transistor having the oxide semiconductor layer, and the oxide semiconductor layer can be used as a channel layer and the photo sensing layer. The oxide semiconductor layer may be a material comprising at least one of In, Ga, Zn. The oxide semiconductor layer of the photo sensing transistor TFT2 is coupled to the source and drain of the photo sensing transistor TFT2. In one exemplary embodiment of the present disclosure, the oxide semiconductor layer of the photo sensing transistor TFT2 can be an In—Ga—Zn—O (IGZO) thin film transistor.

The photo sensing transistor TFT2 further has a gate insulating layer deposited between the gate and the oxide semiconductor layer, so as to prevent the gate from contacting the oxide semiconductor layer. The gate of the photo sensing transistor TFT2 may be a material comprising at least one of Mo, Cr, Al, Ti, Ta, and Ni.

The switching transistor TFT1 may be an oxide thin film transistor having the oxide semiconductor layer, and the oxide semiconductor layer can be used as a channel layer and the photo sensing layer. The oxide semiconductor layer may be a material comprising at least one of In, Ga, Zn. The oxide semiconductor layer of the photo sensing transistor TFT2 is coupled to the source and drain of the switching transistor TFT1. In one exemplary embodiment of the present disclosure, the oxide semiconductor layer of the switching transistor TFT1 can be an In—Ga—Zn—O (IGZO) thin film transistor.

The switching transistor TFT1 further has a gate insulating layer deposited between the gate and the oxide semiconductor layer, so as to prevent the gate from contacting the oxide semiconductor layer. The gate of the switching transistor TFT1 may be a material comprising at least one of Mo, Cr, Al, Ti, Ta, and Ni.

The thickness of the oxide semiconductor layer in the oxide thin film transistor can be adjusted to change the voltage level of the threshold voltage thereof. Therefore, the above photo sensing transistor TFT2 and switching transistor TFT1 can be implemented by two oxide thin film transistors. However, the above photo sensing transistor TFT2 and switching transistor TFT1 are not limited to be implemented by two oxide thin film transistors. The other transistors which the threshold voltages can be adjusted may be also used to implement the above photo sensing transistor TFT2 and switching transistor TFT1.

The photo sensing transistor TFT2, the switching transistor TFT1, and the storage capacitor Cs are deposited on the substrate, and the protection insulating layer can be deposited on the photo sensing transistor TFT2 and the switching transistor TFT1, so as to integrate the photo sensing unit. It is noted that, the integrated photo sensing unit 10 is not intended to limit the present disclosure, and the sensing circuit unit 10 can also be implemented by using discrete circuit elements in another exemplary embodiment of the present disclosure.

Exemplary Embodiment of Photo Sensor Array

Figure 4:
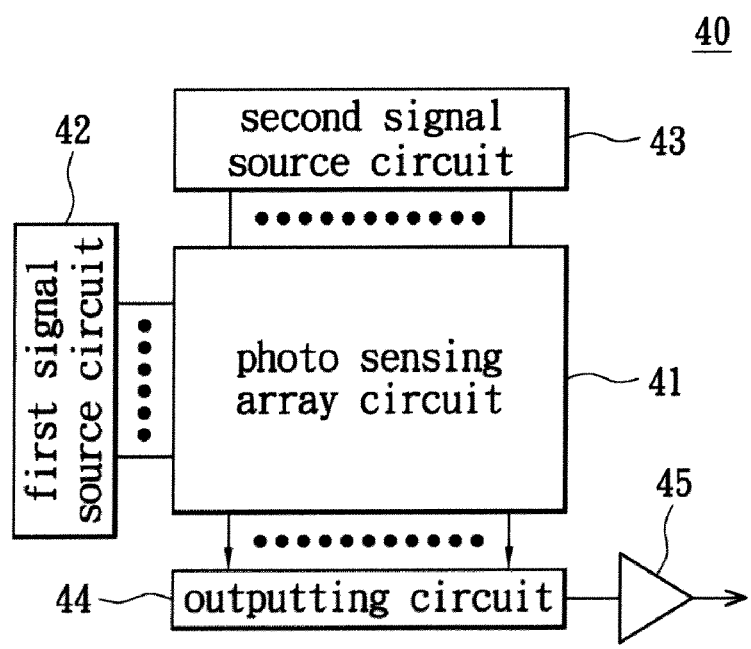
FIG. 4 is a circuit diagram of a photo sensor array according to an exemplary embodiment of the present disclosure.

Referring to FIG. 4, FIG. 4 is a circuit diagram of a photo sensor array according to an exemplary embodiment of the present disclosure. The photo sensor array 40 is one kind of the photo sensor, and the photo sensor array 40 comprises a photo sensing array circuit 41, a first signal source circuit 42, a second signal source circuit 43, an outputting circuit 44, and an amplifying circuit 45. The photo sensing array circuit 41 comprises a plurality of the photo sensing units 20 of FIG. 2, and the photo sensing units 20 are arranged in an array form. The first signal source circuit 42 is used to provide the first signal sources V1 of FIG. 2 to the photo sensing units of photo sensing array circuit 41. The second signal source circuit 43 is used to provide the second signal sources V2 of FIG. 2 to the photo sensing units of photo sensing array circuit 41. Furthermore, the photo sensing units 20 of the photo sensing array circuit 41 is coupled to the outputting circuit 44 via the signal readout lines READOUT.

Each photo sensing unit 20 of the photo sensing array circuit 41 detects the light signal for inducing the photo current. During the exposure time, each photo sensing unit 20 of the photo sensing array circuit 41 stores the electrical charges in the storage capacitor Cs, wherein the electrical charges is from the photo current induced by the light signal. During the readout time, each photo sensing unit 20 of the photo sensing array circuit 41 outputs the readout signal stored in the storage capacitor Cs to the outputting circuit 44. The outputting circuit 44 receives the readout signal outputted from each photo sensing unit 20 of the photo sensing array circuit 41, and sequentially outputs the readout signals to the amplifying circuit 45. It is noted that, the photo sensor array may further comprises a filter used to filter the noise of the readout signals, and the filter can placed before or after the amplifying circuit 45.

Referring to FIG. 2 through FIG. 4, the operation of the photo sensor array 40 is illustrated as follows. First, during the exposure time, the photo sensing array circuit 41 obtains the light signal of the emitting light source. Meanwhile, the first signal source circuit 42 provides a fixed bias voltage acting as the first signal source V1, and the second signal source circuit 43 provides a write voltage acting as the second signal source V2.

After the exposure time has elapsed, the photo sensing array circuit 41 has stored the electrical charges from photo currents induced by the light signals in the storage capacitor Cs in a sequential fashion of the array, the electrical charges from photo currents induced by the light signals stored in the storage capacitor Cs are waiting to be readout. Then, during the readout time, the second source circuit 43 provides a readout voltage acting as the second signal source V2. Meanwhile, the outputting circuit 44 obtains the readout signals outputted from the photo sensing array circuit 41. The outputting circuit 44 may sequentially transmit the readout signals to the amplifying circuit 45. Last, the amplifying circuit 45 sequentially outputs the amplified readout signals.

It is noted that, the second signal sources V2 provided by the second signal source circuit 43 to the photo sensing units 20 may not be the same one, and the first signal sources V1 provided by the first signal source circuit 41 to the photo sensing units 20 may not be the same one, to control the exposure time and the readout time of each photo sensing unit 20. In general, the rows of the photo sensing array circuit 41 are sequentially exposed. After all rows of the photo sensing array circuit 41 have been exposed, the rows of the photo sensing array circuit 41 are sequentially readout. In addition, in the other exemplary embodiment, the rows of the photo sensing array circuit 41 are still sequentially exposed, but when the current row of the photo sensing array circuit 41 is exposed, the above row of the current row can be simultaneously readout, such that the long readout time and the reset time can be reduced.

Possible Result of Exemplary Embodiment

According to the exemplary embodiment of the present invention, the source of the photo sensing transistor in the photo sensing unit is coupled to the first signal source, and the gates of the photo sensing transistor and the switching transistor in the photo sensing unit is coupled to the second signal source. Because the gates of the photo sensing transistor and the switching transistor in the photo sensing unit can use the same signal source, a number of the signal sources required by the photo sensing unit and the photo sensor according to the exemplary embodiment may be reduced, such that the power saving may be achieved.

The above-mentioned descriptions represent merely the exemplary embodiment of the present disclosure, without any intention to limit the scope of the present disclosure thereto. Various equivalent changes, alternations or modifications based on the claims of present disclosure are all consequently viewed as being embraced by the scope of the present disclosure.

What is claimed is:

1. A photo sensing unit, comprising:
   a photo sensing transistor, having a first gate, a first source, and a first drain, used to receive a light signal for inducing a photo current correspondingly, wherein the first source is coupled to a first signal source, and the first gate is coupled to a second signal source;
   a storage capacitor, having a first end and a second end, used to store a plurality of electrical charges induced from the light signal, wherein the first end is coupled to the first drain, and the second end is coupled to a low voltage; and
   a switching transistor, having a second gate, a second source, and a second drain, controlled by the second signal source, and used to output a readout signal stored in the storage capacitor to a signal readout line, wherein the second source is coupled to the first end, and the second drain is coupled to the signal readout line, and the second gate is coupled to the second signal source;
   wherein a threshold voltage of the photo sensing transistor is higher than that of the switching transistor.

2. The photo sensing unit according to claim 1, wherein the photo sensing transistor and the switching transistor are two oxide thin film transistors, wherein the photo sensing transistor has a first oxide semiconductor layer coupled to the first source and first drain, and the switching transistor has a second oxide semiconductor layer coupled to the second source and second drain.

3. The photo sensing unit according to claim 2, wherein the first and second semiconductor layers is a material containing at least one of In, Ga, Zn.

4. The photo sensing unit according to claim 3, wherein the photo sensing transistor and the switching transistor are two In—Ga—Zn—O (IGZO) thin film transistors.

5. The photo sensing unit according to claim 2, wherein the photo sensing transistor has a first gate insulating layer deposited between the first gate and the first oxide semiconductor layer, so as to prevent the first gate from contacting the first oxide semiconductor layer; and the switching transistor has a second gate insulating layer deposited between the second gate and the second oxide semiconductor layer, so as to prevent the second gate from contacting the second oxide semiconductor layer.

6. The photo sensing unit according to claim 1, wherein the first and second gate is a material containing at least one of Mo, Cr, Al, Ti, Ta, and Ni.

7. The photo sensing unit according to claim 1, further comprising a substrate, wherein the photo sensing transistor, the switching transistor, and the storage capacitor is deposited on the substrate.

8. The photo sensing unit according to claim 7, further comprising a protection insulating layer deposited on the photo sensing transistor and the switching transistor.

9. The photo sensing unit according to claim 1, wherein during an exposure time, the light signal illuminates the photo sensing transistor, the second signal source provides a write voltage, and the first signal source provides a bias voltage, wherein the write voltage is lower than the threshold voltages of the photo sensing transistor and the switching transistor, such that the photo sensing transistor and the switching transistor are turned off, the photo current induced by the light signal conveys the electrical charges to the storage capacitor, and the storage capacitor stores the electrical charges.

10. The photo sensing unit according to claim 9, wherein during a readout time, the second source provides a readout voltage, wherein the readout voltage is less than the threshold voltage of the photo sensing transistor and larger than the threshold voltage of the switching transistor, such that the photo sensing transistor is turned off and the switching transistor is turned on, and the readout signal stored in the storage capacitor is outputted to the signal readout line.

11. A photo sensor, comprising:
a plurality of photo sensing units;
a first signal source circuit, used to provide first signal sources to the photo sensing units;
a second signal source circuit, used to provide second signal sources to the photo sensing units; and
an outputting circuit, used to receive readout signals outputted from the photo sensing units, and to output the readout signals sequentially;
wherein each of the photo sensing units comprises:
a photo sensing transistor, having a first gate, a first source, and a first drain, used to receive a light signal for inducing a photo current correspondingly, wherein the first source is coupled to the first signal source, and the first gate is coupled to the second signal source;
a storage capacitor, having a first end and a second terminal, used to store a plurality of electrical charges induced from the light signal, wherein the first end is coupled to the first drain, and the second end is coupled to a low voltage; and
a switching transistor, having a second gate, a second source, and a second drain, controlled by the second signal source, and used to output the readout signal stored in the storage capacitor to a signal readout line, wherein the second source is coupled to the first end, and the second drain is coupled to the signal readout line, and the second gate is coupled to the second signal source;
wherein a threshold voltage of the photo sensing transistor is higher than that of the switching transistor.

12. The photo sensor according to claim 11, wherein the photo sensing transistor and the switching transistor are two oxide thin film transistors, wherein the photo sensing transistor has a first oxide semiconductor layer coupled to the first source and first drain, and the switching transistor has a second oxide semiconductor layer coupled to the second source and second drain.

13. The photo sensor according to claim 12, wherein the first and second semiconductor layers are a material containing at least one of In, Ga, Zn.

14. The photo sensor according to claim 13, wherein the photo sensing transistor and the switching transistor are two In—Ga—Zn—O (IGZO) thin film transistors.

15. The photo sensor according to claim 12, wherein the photo sensing transistor has a first gate insulating layer deposited between the first gate and the first oxide semiconductor layer, so as to prevent the first gate from contacting the first oxide semiconductor layer; and the switching transistor has a second gate insulating layer deposited between the second gate and the second oxide semiconductor layer, so as to prevent the second gate from contacting the second oxide semiconductor layer.

16. The photo sensor according to claim 11, wherein the first and second gate is a material containing at least one of Mo, Cr, Al, Ti, Ta, and Ni.

17. The photo sensor according to claim 11, further comprising a substrate, wherein the photo sensing transistor, the switching transistor, and the storage capacitor are deposited on the substrate.

18. The photo sensor according to claim 17, further comprising a protection insulating layer deposited on the photo sensing transistor and the switching transistor.

19. The photo sensor according to claim 11, wherein during an exposure time, the light signal illuminates the photo sensing transistor, the second signal source provides a write voltage, and the first signal source provides a bias voltage, wherein the write voltage is lower than the threshold voltages of the photo sensing transistor and the switching transistor, such that the photo sensing transistor and the switching transistor are turned off, the photo current induced by the light signal helps the electrical charges to be transmitted to storage capacitor, and the storage capacitor stores the electrical charges.

20. The photo sensor according to claim 19, wherein during a readout time, the second source provides a readout voltage, wherein the readout voltage is less than the threshold voltage of the photo sensing transistor and larger than the threshold voltage of the switching transistor, such that the photo sensing transistor is turned off and the switching transistor is turned on, and the readout signal stored in the storage capacitor is outputted to the signal readout line.

* * * * *